US012359343B2

(12) United States Patent
Appel et al.

(10) Patent No.: US 12,359,343 B2
(45) Date of Patent: Jul. 15, 2025

(54) WAFER WITH REGIONS OF LOW OXYGEN CONCENTRATION

(71) Applicant: Blue Origin Manufacturing, LLC, Huntsville, AL (US)

(72) Inventors: Jesse S. Appel, South Hamilton, MA (US); Alison Greenlee, Somerville, MA (US); Nathan Stoddard, Chalfont, PA (US); Peter Kellerman, Essex, MA (US); Parthiv Daggolu, Danvers, MA (US); Alexander Martinez, Woburn, MA (US); Saeed Pirooz, Lexington, MA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 265 days.

(21) Appl. No.: 17/634,044

(22) PCT Filed: Aug. 9, 2020

(86) PCT No.: PCT/US2020/045551
§ 371 (c)(1),
(2) Date: Feb. 9, 2022

(87) PCT Pub. No.: WO2021/030235
PCT Pub. Date: Feb. 18, 2021

(65) Prior Publication Data
US 2022/0325438 A1 Oct. 13, 2022

Related U.S. Application Data

(60) Provisional application No. 62/884,767, filed on Aug. 9, 2019.

(51) Int. Cl.
*C30B 29/06* (2006.01)
*H10F 77/122* (2025.01)

(52) U.S. Cl.
CPC ............ *C30B 29/06* (2013.01); *H10F 77/122* (2025.01)

(58) Field of Classification Search
CPC . C30B 29/06; H01L 31/028; H01L 31/02363; H01L 29/06; H10F 77/122
See application file for complete search history.

(56) References Cited

U.S. PATENT DOCUMENTS

| 3,945,864 A | 3/1976 | Goldsmith et al. |
| 4,548,654 A | 10/1985 | Tobin |
| 5,449,532 A | 9/1995 | Toyokawa |

(Continued)

FOREIGN PATENT DOCUMENTS

| CN | 101892515 A | 11/2010 |
| JP | H0558788 A | 3/1993 |

(Continued)

OTHER PUBLICATIONS

WIPO, International Search Report for International Application No. PCT/US2020/045551, Mar. 1, 2021.

*Primary Examiner* — Joanna Pleszczynska
(74) *Attorney, Agent, or Firm* — Summit Patents PC (57) ABSTRACT

A single crystal silicon wafer has a thickness between a first surface and an opposite second surface from 50 μm to 300 μm. The wafer includes a first region extending a first depth from the first surface. The first region has a reduced oxygen concentration relative to an adjacent region of the wafer. The wafer has a bulk minority carrier lifetime greater than 100 μs.

18 Claims, 7 Drawing Sheets

(56) References Cited

U.S. PATENT DOCUMENTS

| | | |
|---|---|---|
| 5,882,989 A | 3/1999 | Falster |
| 6,100,570 A | 8/2000 | Saito |
| 6,117,231 A | 9/2000 | Fusegawa et al. |
| 6,325,848 B1 | 12/2001 | Watanabe |
| 6,518,200 B2 | 2/2003 | Lin |
| 6,544,656 B1 | 4/2003 | Abe et al. |
| 6,566,277 B1 | 5/2003 | Nakagawa et al. |
| 6,583,024 B1 | 6/2003 | Kononchuk et al. |
| 6,713,370 B2 | 3/2004 | Falster |
| 6,780,238 B2 | 8/2004 | Park |
| 6,815,605 B1 | 11/2004 | Abe et al. |
| 7,147,711 B2 | 12/2006 | Tamatsuka et al. |
| 7,893,351 B2 | 2/2011 | Terakawa |
| 7,923,625 B2 | 4/2011 | Shima et al. |
| 8,124,867 B2 | 2/2012 | Shima et al. |
| 8,252,624 B2 | 8/2012 | Tanner et al. |
| 8,349,643 B2 | 1/2013 | Terakawa |
| 8,383,927 B2 | 2/2013 | Shima et al. |
| 8,628,995 B2 | 1/2014 | Myong |
| 8,642,449 B2 | 2/2014 | Watanabe et al. |
| 8,648,251 B2 | 2/2014 | Myong |
| 8,771,415 B2 | 7/2014 | Umeno et al. |
| 9,105,786 B2 | 8/2015 | Deluca |
| 9,123,671 B2 | 9/2015 | Chen et al. |
| 9,166,071 B2 | 10/2015 | Phan et al. |
| 9,331,226 B2 | 5/2016 | Yano et al. |
| 9,337,372 B2 | 5/2016 | Ogane et al. |
| 9,917,219 B2 | 3/2018 | Yano |
| 9,951,440 B2 | 4/2018 | Basak et al. |
| 10,340,403 B2 | 7/2019 | Ogane et al. |
| 2003/0177976 A1 | 9/2003 | Oki et al. |
| 2004/0005777 A1 | 1/2004 | Qu et al. |
| 2006/0043517 A1 | 3/2006 | Sasaki et al. |
| 2007/0034251 A1 | 2/2007 | Jonczyk et al. |
| 2009/0266396 A1 | 10/2009 | Niira et al. |
| 2010/0015749 A1 | 1/2010 | Borden |
| 2010/0059114 A1 | 3/2010 | Park et al. |
| 2010/0148310 A1 | 6/2010 | Koo et al. |
| 2011/0020974 A1 | 1/2011 | Shima |
| 2011/0146770 A1 | 6/2011 | Dieter et al. |
| 2011/0227202 A1 | 9/2011 | Park |
| 2011/0297223 A1 | 12/2011 | Krause et al. |
| 2011/0303265 A1 | 12/2011 | Yuan et al. |
| 2012/0222741 A1 | 9/2012 | Davies et al. |
| 2012/0305053 A1 | 12/2012 | Sekimoto et al. |
| 2012/0318350 A1 | 12/2012 | Sakai et al. |
| 2012/0319157 A1 | 12/2012 | Ichuo et al. |
| 2013/0081685 A1 | 4/2013 | Nishimura et al. |
| 2013/0084675 A1 | 4/2013 | Terakawa |
| 2013/0098432 A1 | 4/2013 | Lim et al. |
| 2015/0083203 A1 | 3/2015 | Kim et al. |
| 2015/0132931 A1 | 5/2015 | Kapur et al. |
| 2015/0284875 A1 | 10/2015 | Veirman et al. |
| 2016/0108549 A1 | 4/2016 | Kellermen et al. |
| 2017/0051429 A1 | 2/2017 | Sachs et al. |
| 2017/0051430 A1 | 2/2017 | Sun et al. |
| 2017/0207354 A1 | 7/2017 | Lee et al. |
| 2018/0013021 A1 | 1/2018 | Kai |
| 2018/0138334 A1 | 5/2018 | Lee et al. |
| 2018/0347071 A1 | 12/2018 | Kimbel |
| 2018/0355509 A1 | 12/2018 | Samanta et al. |
| 2019/0006534 A1 | 1/2019 | Fujita et al. |
| 2019/0161888 A1 | 5/2019 | Masada et al. |

FOREIGN PATENT DOCUMENTS

| | | |
|---|---|---|
| JP | 2001267610 A | 9/2001 |
| JP | 2003258287 A | 9/2003 |
| JP | 2012520563 A | 9/2012 |
| JP | 2015532529 A | 11/2015 |
| KR | 100783440 B1 | 12/2007 |

WAFER WITH REGIONS OF LOW OXYGEN CONCENTRATION

CROSS-REFERENCE TO RELATED APPLICATIONS

This application claims priority to the provisional patent application filed Aug. 9, 2019 and assigned U.S. App. No. 62/884,767, the disclosure of which is hereby incorporated by reference.

FIELD OF THE DISCLOSURE

This disclosure relates to wafers, such as silicon wafers used for solar applications.

BACKGROUND OF THE DISCLOSURE

Silicon wafers or sheets may be used in, for example, the integrated circuit or solar cell industry. Demand for solar cells continues to increase as the demand for renewable energy sources increases. One major cost in the solar cell industry is the wafer or sheet used to make solar cells. Reductions in cost or improvements in quality to the wafers or sheets may reduce the cost and/or increase the efficiency of solar cells and make this renewable energy technology more prevalent.

Previously, cut silicon wafers were made by wire-sawing large silicon ingots or boules made from the Float-Zone process, Czochralski (Cz) process, modified Czochralski process where magnetic fields are used to control oxygen, or a direct cast process. Changes in the oxygen profile through the thickness of any cut of these wafers (wafers <2 mm thick) is negligible. Many times the oxygen profile is nearly uniform across a wafer.

High efficiency crystalline silicon solar cells typically require a thin (50-300µm) silicon substrate with a high bulk minority carrier lifetime (MCL) that is over 100 µs. The majority of silicon substrates used for solar cells today are made by wire-sawing large single-crystal ingots produced by the Cz process. These wafers have significant oxygen concentrations and oxygen-precipitate defects that degrade the final solar cell performance, such as by one or more the following mechanisms. First, oxygen precipitates and their resulting defects internally getter metallic contamination. This internal gettering prevents metallic contamination from being removed from the bulk during cell processing and, thus, gives rise to a solar cell with a low bulk MCL and corresponding poor efficiency. Second, interstitial oxygen reacts with boron doping to form a boron-oxygen complex that also reduces MCL. Third, oxygen in phosphorous-doped wafers can create traps that reduce MCL. Finally, the oxygen precipitates and corresponding bulk material defects create stress concentrations that reduce the overall wafer strength and, therefore, cause breakage in cell processing.

Techniques were developed by semiconductor device manufacturers to reduce oxygen in the outer layers of a silicon wafer, but these processes do not produce the desired wafer needed for high-efficiency solar cells. First, manufacturers can dwell a silicon wafer at high temperature (>1000° C.) for several hours (e.g., 12-20 hours) in a reducing, inert, or oxidizing ambient (e.g., an argon or an argon and hydrogen atmosphere) so that the material's bulk oxygen diffuses to the wafer surfaces and then outgases to the environment. In the semiconductor industry, the resulting low-oxygen profile near the wafer surfaces (known as a "denuded zone") is approximately 10-80 µm deep and the wafer thickness is over 600 µm (e.g., the denuded zone is less than 20% of the total wafer thickness). This relatively shallow denuded zone may be sufficient for some semiconductor devices that are built on and interact with only the top 10 µm to 100 µm of the wafer surface. Such a shallow denuded zone may be insufficient for solar cells or other applications that use more of the wafer thickness during operation.

Unfortunately, the bulk material away from the denuded zone has high concentrations of oxygen precipitates that internally getter metallic contamination using this annealing technique. This degrades the bulk MCL. A wafer exposed to such a high temperature dwell also will have high levels of metallic contamination sourced from the environment which will reduce bulk MCL. In this long high temperature dwell, the thin wafers (50-300 µm) needed for economic solar cell production also would warp, bow, or potato chip; generate thermal stress defects; and likely have mechanical breakage issues in solar cell processing. Furthermore, CZ substrates have radial interstitial oxygen gradients that create correspondingly low radial MCL profiles. Even ignoring these defects and drawbacks, the economics of solar cell processing are such that the capital intensity of a 12-20 hour anneal to create this denuded zone is cost-prohibitive. Thus, creating a thin wafer with a low-oxygen denuded zone and high MCL for high-efficiency solar cells using annealing results in poor quality wafers and is not cost-effective.

The non-denuded area (>20%) of the annealed semiconductor wafer can grow large bulk micro defects (BMDs) in the central thickness of the wafer. These BMDs internally getter metallic contamination to the center of the wafer and, thus, ensure low levels of metallic contamination in the denuded zone, but provide low lifetimes in the remaining central wafer thickness. Strong internal gettering in the material bulk via large BMDs is undesirable for solar cells because solar cells require high lifetime material throughout the bulk of the wafer. Although a low-oxygen denuded zone may be beneficial for a solar wafer, the annealing process used to create this zone results in undesirable BMDs and contamination in the wafer bulk that reduce the final bulk material lifetime.

Currently furnace annealing techniques also lead to stress profiles (i.e., breakage) and/or low MCL profiles caused by contamination. During the annealing, the thin wafers generate dislocations or slip that would reduce MCL at the regions supported by a carrier boat or bond to a supporting wafer. An additional reason to not use a standalone annealing furnace is defect creation. A standalone high temperature annealing furnace mechanically touches a wafer during high temperatures. Those touch points have high metallic contamination and generate slip or dislocations that locally degrade electrical performance. While this is acceptable for semiconductor wafers that do not use the whole wafer, it is not acceptable for a solar wafer that makes a device from the entire wafer.

Furthermore, creating a denuded zone requires a separate annealing step after formation of the wafer, which is costly and risks adding contamination to the solar wafer. The denuded zone using this process only occurs on one side of the wafer during the anneal.

Another technique to create a low-oxygen layer on a wafer surface is to epitaxially grow a thin, low-oxygen silicon film via chemical vapor deposition techniques. In the semiconductor industry, a few microns of silicon film can be deposited on a relatively thick (>600 µm) single crystal CZ wafer to create low-oxygen surfaces. However, it is not possible to deposit relatively thick (>20 µm) epitaxially grown films on thin silicon wafers (50-300 µm) without generating significant material stress, stacking faults that reduce MCL and shunt a solar cell, and warpage. Furthermore, creating thick, low-oxygen silicon layers on thin silicon wafers with epitaxial growth would be cost-prohibitive for high-efficiency solar cell manufacturers, even if feasible.

Single crystal silicon wafers can be made that exhibit low oxygen concentrations (<1 ppma) uniformly through the wafer thickness. The oxygen concentration near the surface of these wafers is approximately the same as that in the inner bulk region away from the wafer surfaces. Specifically, wire-sawn float zone wafers can have a uniform oxygen concentration through the thickness at levels below 1 ppma. Float-zone wafers are cost-prohibitive for mainstream commercial solar cell manufacturing.

Epitaxial growth was used to directly make a large, single-crystal silicon wafer without cutting. The resulting wafer also does not have an oxygen profile with any variation through the thickness. A thin silicon wafer can be completely grown by epitaxial deposition that is then lifted off or cleaved from its template substrate. This epitaxial wafer would have a uniform oxygen concentration through its thickness.

Finally, single crystal wafers made by wire-sawing cast single crystal bricks can have uniform and low oxygen concentrations through the bulk, and such cast wafers have lower efficiency resulting from other bulk material defects.

One promising method that has been investigated to lower the cost of materials for solar cells is the horizontal ribbon growth (HRG) technique where crystalline sheets are pulled horizontally along the surface of a melt. In this method, a portion of a melt surface is cooled sufficiently to locally initiate crystallization with the aid of a seed, which may be then drawn along the melt surface to form a crystalline sheet. The local cooling may be accomplished by providing a device that rapidly removes heat above the region of the melt surface where crystallization is initiated. Under proper conditions, a stable leading edge of the crystalline sheet may be established in this region.

In order to sustain the growth of this faceted leading edge in a steady-state condition with the growth speed matching the pull speed of the monocrystalline sheet, or "ribbon," intense cooling may be applied by a crystallizer in the crystallization region. This may result in the formation of a monocrystalline sheet whose initial thickness is commensurate with the intensity of the cooling applied. The initial thickness is often on the order of 1-2 mm in the case of silicon ribbon growth. For applications such as forming solar cells from a monocrystalline sheet or ribbon, a target thickness may be on the order of 200 μm or less. This necessitates a reduction in thickness of the initially formed ribbon. This may be accomplished by heating the ribbon over a region of a crucible containing the melt as the ribbon is pulled in a pulling direction. As the ribbon is drawn through the region while the ribbon is in contact with the melt, a given thickness of the ribbon may melt back, thus reducing the ribbon thickness to a target thickness. This melt-back approach is particularly well suited in the so-called Floating Silicon Method (FSM), wherein a silicon sheet is formed on the surface of a silicon melt according to the procedures generally described above.

In spite of these benefits using HRG, lifetime or other improvements to wafers produced using HRG would be beneficial. Improved wafers with low oxygen concentration regions are needed for higher efficiency solar cells and better semiconductor device performance.

BRIEF SUMMARY OF THE DISCLOSURE

A wafer is disclosed in a first embodiment. The wafer includes single crystal silicon having a thickness between a first surface and a second surface from 50 μm to 300μm. The first surface and the second surface are opposite each other. The wafer includes a first region extending a first depth from the first surface toward the second surface. The first region has a reduced oxygen concentration relative to a bulk region of the wafer. The wafer has a bulk minority carrier lifetime greater than 100 μs. The first region can have an oxygen concentration from 0.1 to 8.0 ppma.

In an instance, the first surface and the second surface are flat surfaces with a largest surface area on the wafer.

The bulk region of the wafer can have an oxygen concentration from 8 to 25 ppma.

The first depth may be at least 5 μm. In an instance, the first depth is from 10% to 90% of the thickness. For example, the first depth can be approximately 30% of the thickness.

The first region can have a reduced concentration of bulk micro defects relative to the bulk region of the wafer.

The wafer can further include a second region extending a second depth from the second surface toward the first surface. The second region has a reduced oxygen concentration relative to the bulk region of the wafer disposed between the first region and the second region. The second region can have an oxygen concentration from 0.1 to 8.0 ppma.

The second depth may be at least 5 μm. The first depth and the second depth combined can be from 10% to 90% of the thickness. In an instance, the second depth is approximately 10% of the thickness. The first region and the second region can have a reduced concentration of bulk micro defects relative to the bulk region of the wafer disposed between the first region and the second region. The first depth and the second depth may be different distances.

The wafer may be a square, pseudo-square, rectangle, or circle.

The wafer can further include a dopant.

The wafer can have an average oxygen precipitate count from 0 to 1e11/cm$^3$ in the first region.

A solar cell can be manufactured using the wafer of the first embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

It would be beneficial for solar cells to be made with wafers that have low oxygen content especially in the material regions near the wafer surfaces where most of the sunlight is absorbed and the device junction is made. Industry data has shown that boron-oxide degradation can scale with the square of the interstitial oxygen concentration, and that keeping this concentration below 8 ppma minimizes this degradation mechanism. Furthermore, the final bulk oxygen precipitate densities in the finished device should be lower than $10^9/cm^3$ to create high efficiency solar cells.

Figure 1:
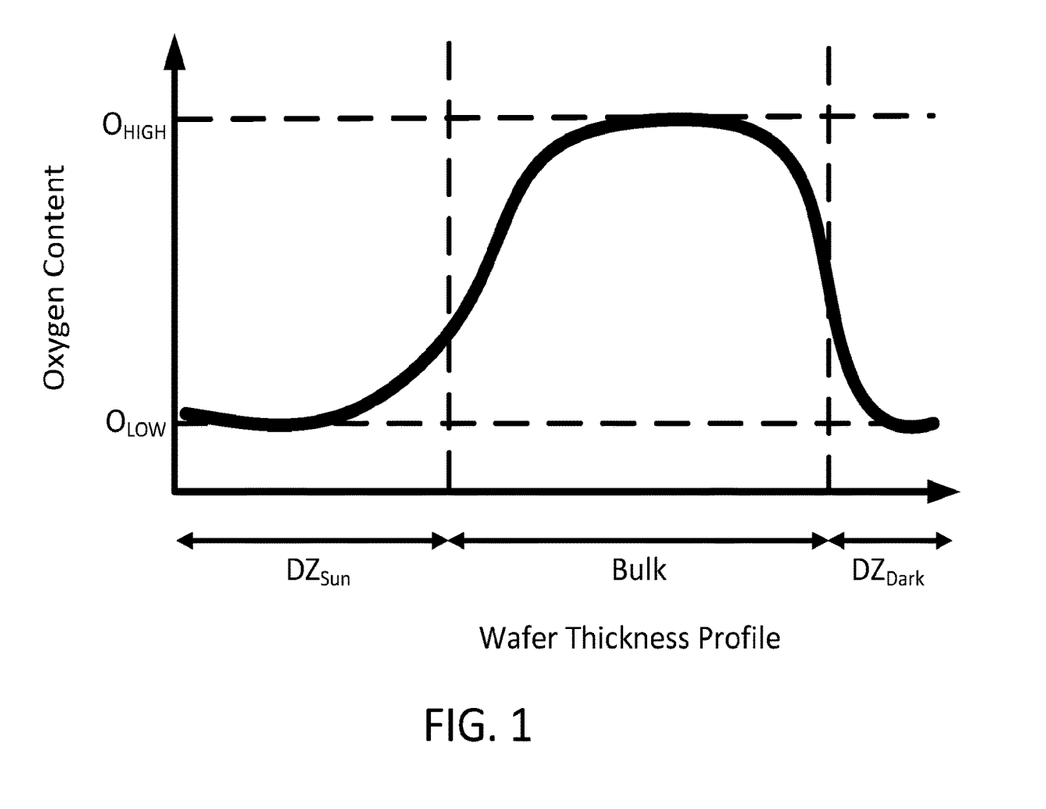
FIG. 1 is a chart of profile of a wafer with an asymmetric, front and back denuded zone profile in accordance with the present disclosure, wherein both the front and back denuded zones ($DZ_{Front}$ and $DZ_{Back}$) are characterized by having low bulk oxygen content ($O_{LOW}$) compared to the bulk oxygen content ($O_{HIGH}$)
Figure 2:
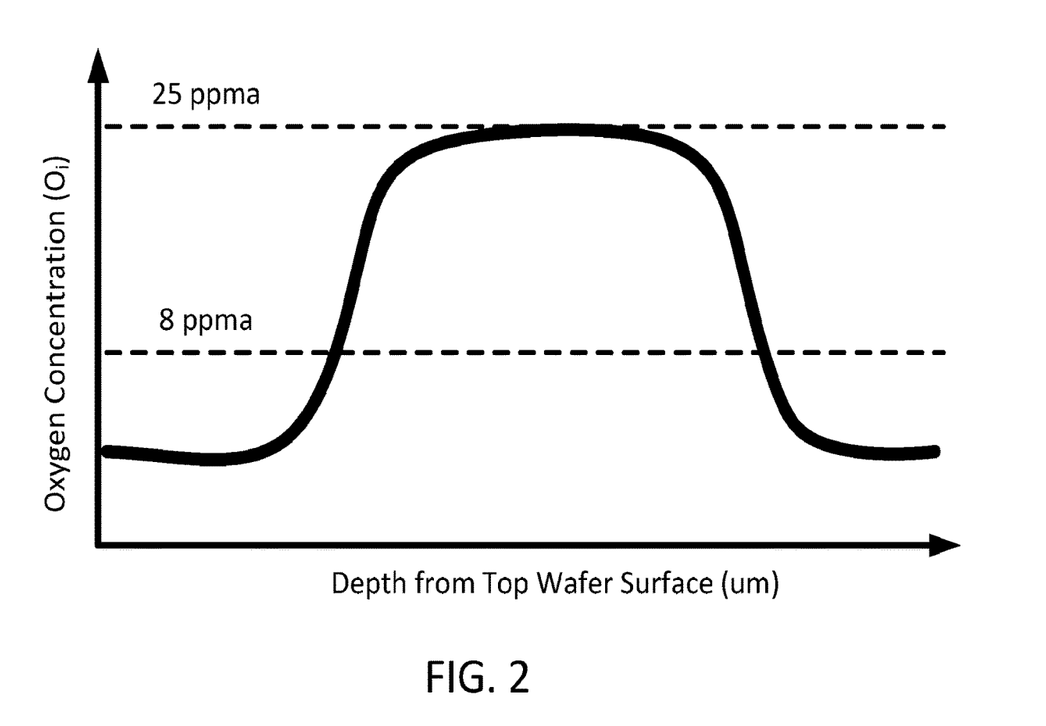
FIG. 2 illustrates an embodiment of an oxygen profile in accordance with the present disclosure.

Embodiments herein disclose a silicon wafer that exhibits the following combination of highly desirable material properties for a high-efficiency solar cell. A thin (50-300μm), single-crystal silicon wafer with low-oxygen concentration profiles extending from one or both of its surfaces can be formed, as shown in FIG. 1 or FIG. 2. These low-oxygen regions can exhibit a total oxygen concentration of less than 8 ppma and can occupy 10%-90% of the total wafer thickness. The remaining bulk wafer oxygen concentration away from the low-oxygen zone may be from 8 ppma to 25 ppma. These low-oxygen regions may be as large as possible to minimize the aforementioned oxygen-driven solar cell degradation mechanisms. The low-oxygen regions can extend from the light-facing, rear, or both surfaces and can be symmetric or asymmetric. In an instance, the lowest oxygen profiles extend from the wafer surface that faces the sun because it absorbs the majority of the light and has the highest impact on final solar cell efficiency. In another instance, a low oxygen region extends from the wafer surface not facing the light (i.e., rear surface) because that is where solar cell features are located. Shallower low-oxygen depths may be used because the process conditions that create deeper low-oxygen profiles may also result in more contamination. Furthermore, shallower low-oxygen depths may be beneficial because interstitial oxygen can improve the mechanical strength of wafers by offering slip resistance. Nitrogen doping can be used to counter the lost mechanical strength resulting from reduced oxygen concentrations without affecting electrical performance.

Figure 3:
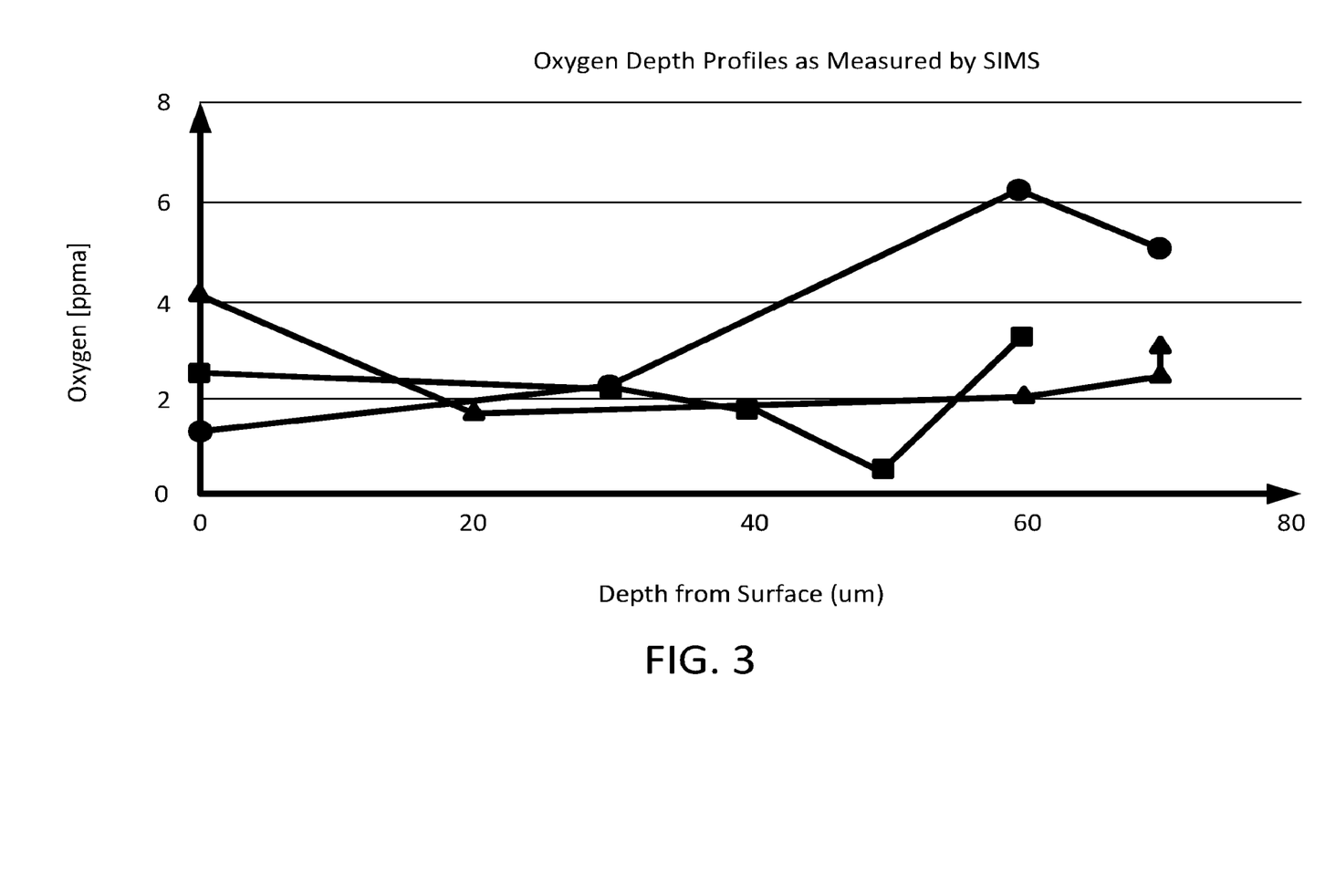
FIG. 3 illustrates a SIMS measurement of an exemplary wafer.

A wafer exhibiting a denuded zone or low-oxygen region through a large fraction of the wafer thickness is different from previous wafers where only a relatively thin top layer of the wafer exhibits low oxygen. Providing a low oxygen profile through a larger fraction of the thickness provides benefits for solar cell devices because the final efficiency depends on the bulk material properties rather than the quality the material near the wafer surface, such as with semiconductor devices. Semiconductor device performance generally depends on the material properties of only the top 80 μm and not the bulk material properties like with solar cell performance. FIG. 3 shows measured oxygen concentration as a function of depth from the wafer surface as measured by SIMS. The corresponding bulk oxygen concentration of these profiles was over 15 ppma as measured by FTIR. These measured profiles can be representative of both wafer sides.

Figure 4:
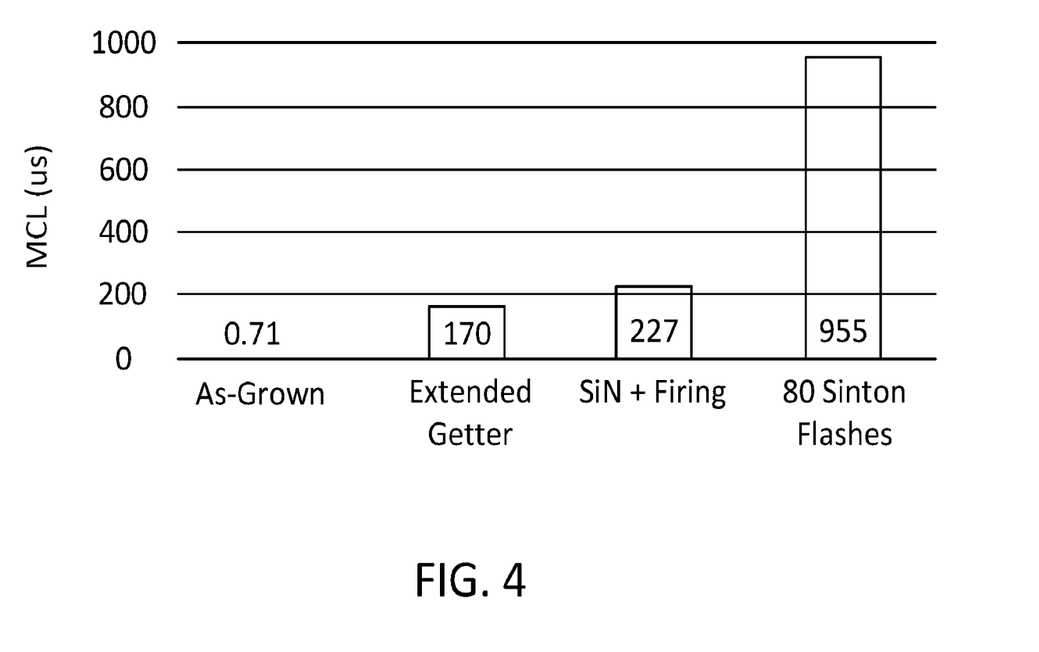
FIG. 4 illustrates measured MCL of an exemplary wafer during the different stages of solar cell processing where the lifetime increases from <1 μs to 955 μs.
Figure 5:
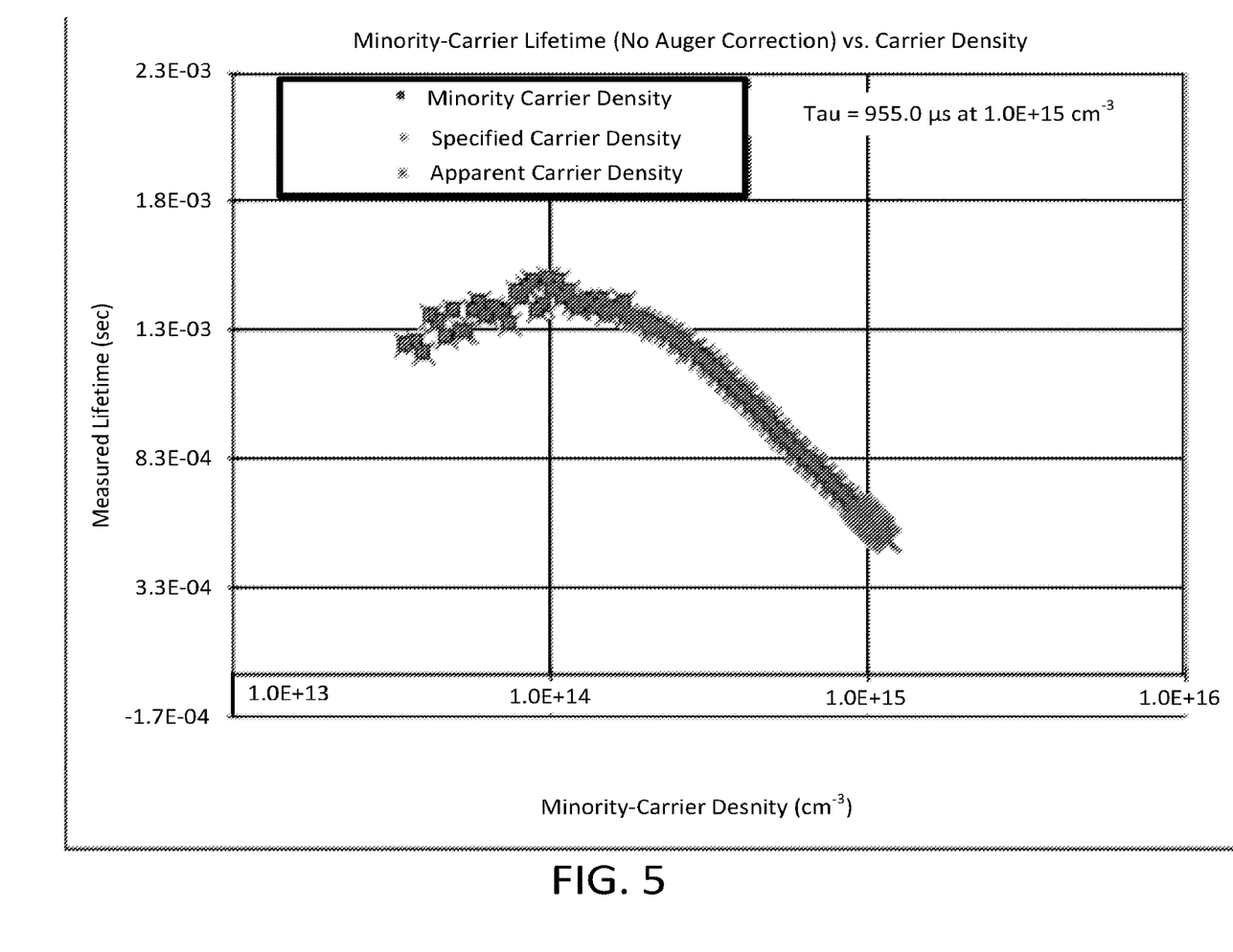
FIG. 5 illustrates the final measured bulk MCL of the wafer after solar cell processing.

This thin wafer with the disclosed oxygen profiles also can exhibit a final bulk MCL in the final solar cell device that is higher than 100 μs at the material resistivity for typical solar cells. As the final solar cell efficiency depends on the combination of the MCL and resistivity, this 100 μs MCL is measured on a wafer doped to a resistivity between 0.1 ohm-cm and 10 ohm-cm. Current p-type solar cells currently use doping between 0.5 ohm-cm to 3 ohm-cm, and n-type solar cells currently use doping between 2 ohm-cm and 6 ohm-cm. The doping material can be boron, gallium, phosphorous, antimony or other known dopants for silicon. Furthermore, this MCL can be measured on a wafer that is made into a solar cell device. Solar cell processing can getter metallic contamination and passivate defects to increase a wafer's as-grown MCL. The disclosed low oxygen profile does not readily generate oxygen precipitates, so the wafer's bulk MCL can increase in solar cell processing as shown in FIG. 4 to give the final measured MCL shown in FIG. 4. The wafer's ability to increase bulk MCL over three orders of magnitude is unlike previous wafers where the oxygen precipitates in the bulk would internally getter metallic contamination and prevent this increase. Embodiments disclosed herein can have bulk oxygen precipitate densities lower than $10^9/cm^3$ for this bulk MCL.

A wafer is disclosed, which can be used for solar, semiconductor, or other applications. The wafer can include silicon, but also can include or be fabricated from germanium, gallium oxide, sapphire, and/or other materials. The wafer may be single crystal with (100), (110), or (111) orientations. Dopants or other additives, such as phosphorous, boron, gallium, arsenic, indium, germanium, antimony, aluminum, bismuth, lithium, or nitrogen, also may be incorporated into the wafer.

In an instance, the wafer has a thickness from a first surface to a second surface from 50 μm to 1 mm, including all values to the 1.0 μm and ranges in between. The first surface and the second surface are opposite each other. In an embodiment, the thickness of the wafer is from 50 μm to 950 μm. In another embodiment, the thickness of the wafer is from 50 μm to 600 μm or from 50 μm to 300 μm. The first and second surfaces may be surfaces of the wafer that have the largest surface area on the wafer and may be flat or textured. The wafer may be a square, pseudo-square, rectangle, or circle. Circular wafers can include a flat at the edge.

For solar cell applications, the thickness of the wafer may be from 50 μm to 300 μm. The silicon substrate may be at least 50 μm thick to absorb a sufficient fraction of the incoming solar spectrum. Silicon substrates thicker than 300 μm may require additional processing time for gettering and more feedstock material. The wafer may be single crystal to avoid grain boundaries because grain boundaries can reduce cell efficiency and/or mechanical strength.

Figure 6:
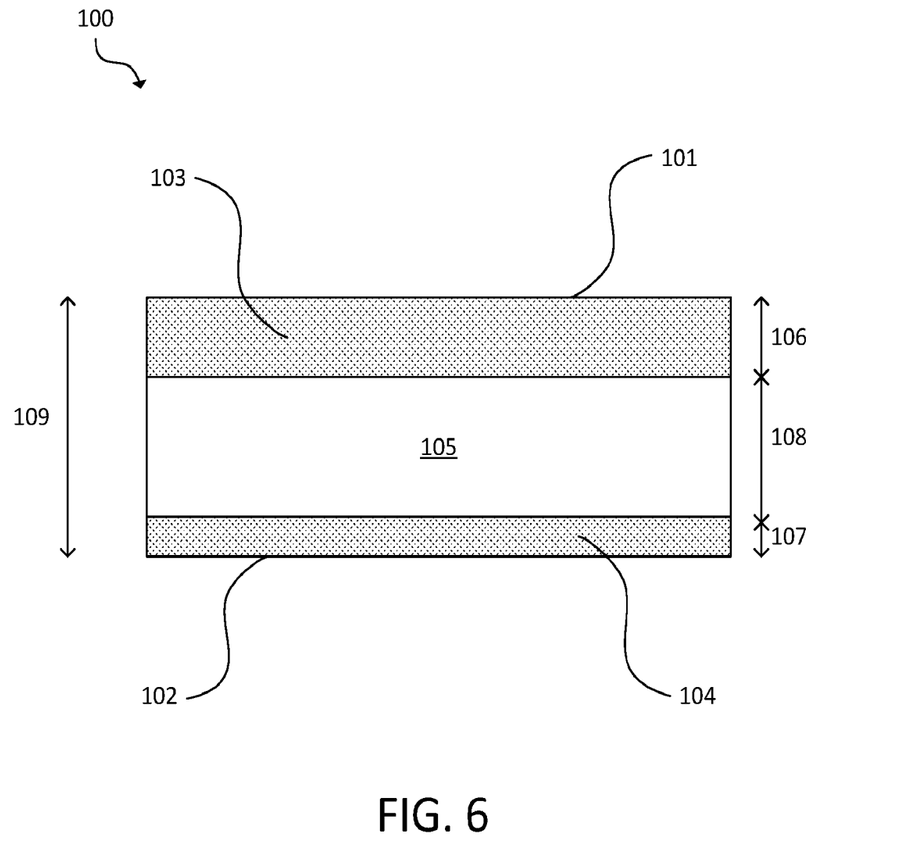
FIG. 6 is a cross-sectional view of an exemplary wafer in accordance with the present disclosure.

The wafer 100 can include a first region 103 extending a first depth 106 from the first surface 101 and a second region 104 extending a second depth 107 from the second surface 102, such as shown in FIG. 6. The first region 103 and the second region 104 are examples of denuded zones. The first surface 101 and second surface 102 can be outer surfaces of the wafer 100. The first region 103 and the second region 104 have a reduced oxygen concentration relative to a remainder of the wafer disposed between the first region and the second region (i.e., the center bulk 103 with a thickness 108). The first region 103 and the second region 104 are denuded zones. In an instance, the first region 103 and the second region 104 have an oxygen concentration from 0.1 to 8.0 ppma, including all values to the 0.1 ppma and range in between. The first region 103 and/or the second region 104 have an oxygen concentration from 0.1 to 7.0 ppma, 0.1 to 5.0 ppma, 0.1 to 3.0 ppma, 0.1 to 2.0 ppma, or 0.1 to 1.0 ppma. By having a low oxygen concentration in the first region 103 and at the first surface 101, the highest quality, best performing material can be used where most electrical activity occurs in a solar cell.

Wafers for solar cells may have a bulk oxygen content range from 8 ppma to 25 ppma in a region between the first region 103 and the second region 104 (i.e., the bulk region 105), such as directly adjacent to the first region 103 or second region 104 or in the center of the wafer 100. Wafers with bulk oxygen content above 10 ppma can form defects that reduce the final solar cell efficiency. In boron-doped material, oxygen can bond with the boron to form complexes that reduce lifetime. This mechanism is often referred to as light-induced degradation. Silicon can be brittle, and interstitial oxygen can increase wafer mechanical robustness. Wafers with oxygen content below 1 ppma can be fragile and may have high breakage rates during processing. Semiconductor and other applications can have a larger oxygen content than solar cells.

The first depth 106 and the second depth 107 can vary in dimension and may be different from each other. The first depth 106 and the second depth 107 may be at least 5 µm. In an instance, the first depth 106 is at least approximately 10% of the thickness 109 of the wafer 100 and may be up to 90%, including all values to the 1% and ranges in between. In another instance, the first depth 106 is approximately 30% of the thickness 109 of the wafer 100. In yet another instance, the first depth 106 is from approximately 10% to approximately 50% of the thickness 109 of the wafer 100, including all values to the 1% and ranges in between. In an instance, the second depth 107 is approximately 10% of the thickness 109 of the wafer 100. The first depth 106 and the second depth 107 combined may occupy between 10% and 90% of the thickness 109 of the wafer 100, including all values to the 1% and ranges in between. Thus, the sum of the distance of the first depth 106 and the distance of the second depth 107 may be from 10% to 90% of a total thickness 109 of the wafer 100.

The first region 103 and the second region 104 can have a reduced concentration of BMDs relative to the remainder of the wafer 100 disposed between the first region 103 and the second region 104 (i.e., the bulk region 105). In an instance, the first region 103 and the second region 104 have no bulk micro defects. The reduced concentration of BMDs also can exist in the non-denuded region (e.g., the bulk region 105 between the first region 103 and the second region 104).

For solar cells, a BMD count from 0/cm$^3$ to 1e11/cm$^3$ may be present in the first region 103 and the second region 104. High oxygen in combination with internal structural defects can precipitate oxygen clusters (e.g., BMDs) that act as internal gettering sites for metallic impurities. Wafers with BMDs can result in lower solar cell efficiency. High BMD counts and other structural defects can reduce wafer mechanical strength and lead to solar cell breakage. Semiconductor and other applications can have a larger BMD counts than solar cells. There may be a higher concentration of BMDs in the non-denuded region (i.e., in the bulk region 105 relative to the first region 103 and the second region 104).

For solar cells, the denuded zone of the first region 103 and/or the second region 104 can extend ≥10% of wafer thickness. As shown in FIG. 1, a denuded zone (DZ) is characterized by having no BMDs, lower oxygen concentration than the bulk, and no excess of vacancies or interstitials. Having a fraction of the wafer thickness (e.g., >10%) exhibit a denuded zone is well-suited for having high electrical properties. Lower vacancy counts can occur in the first region, the second region, and/or the non-denuded region (e.g., the region between the first region and the second region).

Figure 7:
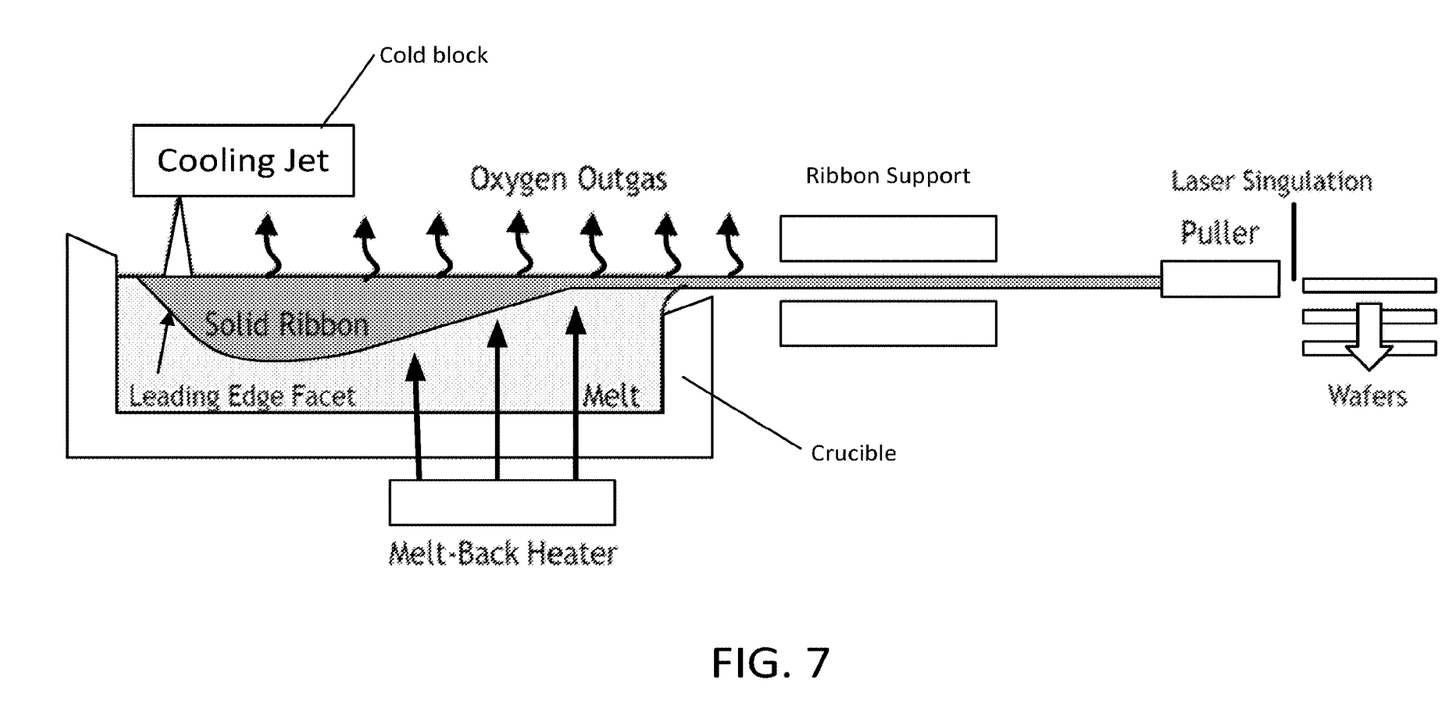
FIG. 7 is an exemplary cross-section of a system in accordance with the present disclosure for producing a wafer.

The first region 103 and the second region 104 can have silicon vacancies. The concentration of the vacancies can depend on the crystal pulling speed and the thermal gradient across the growth front during formation, such as using the system in FIG. 7.

The minority carrier lifetime (MCL) of the wafer may be greater than 100 µs and/or less than or equal to 50000 µs, including all values to the 1.0 µs and ranges in between. MCL is how long an excited electron remains in the conduction band and influences solar cell efficiency. For high efficiency solar cells, the MCL may be greater than 100 µs.

While disclosed with both a first region 103 and a second region 104, certain wafers may only have a first region 103 with reduced oxygen concentration.

For solar cells, having a denuded zone on at least the sun-facing side (where most of the light is absorbed) of the wafer is beneficial. It also can be helpful to have a denuded zone on the dark-side of the wafer. The respective size of the front and back denuded zones may be tailored to both maximize electrical performance for a given solar cell architecture and to enable sufficient mechanical strength. Mechanical strength can correlate with oxygen content. FIG. 1 shows an example of a wafer that exhibits both front and back denuded zones of differing size. Note both the magnitude of oxygen content in the denuded zone and the bulk, along with the wafer thickness.

Table 1 lists exemplary material properties for solar cells. The properties of Table 1 are exemplary and other values or properties are possible.

TABLE 1

| Wafer material properties | |
|---|---|
| Property (units) | Range |
| Average Thickness (µm) | 50-300 |
| Microstructure | Single crystal |
| Crystal Orientation | (100) |
| Average Minority Carrier Lifetime (µs) | >100 |
| Bulk Oxygen Content ($O_{HIGH}$, ppma) | 8-25 |
| Denuded Zone Oxygen Content ($O_{LOW}$, ppma) | 0.1-8 |
| Fraction of the Wafer Thickness with Denuded Zone (%) | 10%-90% |
| Sun-Side Denuded Zone Thickness Fraction (%) | 10%-90% |
| Dark-Side Denuded Zone Thickness Fraction (%) | 0%-30% |
| Average Oxygen Precipitate Count (count/cm$^3$) | 0-1e11/cm$^3$ |

In Table 1, the first region 103 is the sun-side denuded zone and the second region 104 is the dark-size denuded zone.

Average thickness can be measured using calipers, micrometers, laser scanning or other techniques. Crystal orientation can be measured using, for example, XRD.

Microstructure can be measured using XRD, visual inspection, or other techniques. Average minority carrier lifetime can be measured by Sinton QSSPC, u-PCD, or other techniques. Average minority carrier lifetime can be measured on a wafer passivated by iodide-ethanol or other materials that has been processed into a solar cell. Bulk oxygen content can be measured using, for example, FTIR. The oxygen content, fraction of wafer thickness with the denuded zone, or thickness fractions can be measured using SIMS, FTIR, or other techniques.

The wafer can be doped with silicon dopants, which include phosphorous, boron, gallium, arsenic, indium, germanium, or other materials. Thus, the wafer can be p-type or n-type.

The wafer can have a nitrogen level from $1e13/cm^3$ to $1e15/cm^3$, which can be measured in $atm/cm^3$. Nitrogen can be diffused into the wafer. Nitrogen concentrations in this range can be used to increase mechanical performance.

Hydrogen also can be diffused into the wafer. Diffusing in hydrogen to the final wafer can reduce electrical activity of recombination centers.

The finished wafer surfaces can be polished or can have different textures. For increased light capture and/or enhanced surface passivation, at least the front of solar cells can be textured. A non-exhaustive list of possible wafer surfaces include the formation of surface pyramids via chemical etching, the formation of silicon nanowires (known as black silicon) through a wet chemistry, or a honeycomb pitting structure via reactive ion etching. The back of the cell can also be textured, but in some cell architectures it can be either untextured or polished to a minimal roughness.

The finished wafer can include device modifications, such as lasered holes, barcodes, or selective doping profiles. To create a device, the wafer is often mechanically or electrically altered. Some examples include either lasering holes through the bulk of the wafer, selectively doping different regions of the wafer, or marking the surface for wafer tracking. While these modifications can physically change a wafer, these modifications do not change the other benefits of denuded zones.

Total thickness variation can be from <0.5 μm to 100 μm. The wafer's total thickness variation may affect cell processing steps like contact firing. Some cell architectures leverage different thickness profiles to achieve different features.

The wafer may be square, pseudo-square, rectangular, circular, or other shapes. For example, the final wafer can be rectangular, square, or circular with critical dimensions (length or diameter) ranging from 1 inch to 18 inches (e.g., 12 inches).

The description herein is not exhaustive of all the different processing steps or additional wafer features needed to create solar, semiconductor, or other devices. Other steps or specifications are possible.

The final wafer in the solar cell device can exhibit specific geometries or material properties for the production of a solar cell. These features do not generally affect the low-oxygen profiles disclosed herein or obscure the final high MCL measured in a finished solar cell that results from the disclosed minimization of oxygen-driven MCL degradation.

In FIG. 2, oxygen concentration profile is shown as a function of depth from the top wafer surface. Specifically, there can be a low-oxygen region (<8 ppma) of a particular thickness on one or both wafer surfaces. As seen in FIG. 3, this oxygen depth profile was measured from the top surface of produced wafers which may be desirable to minimize oxygen-driven solar cell degradation mechanisms.

Embodiments disclosed herein are different from cut Cz wafers because the disclosed wafers have a different oxygen profile through the wafer thickness. A profile with a low oxygen concentration near the surfaces and a high oxygen concentration deeper in the bulk cannot be made by directly cutting an ingot.

In a particular embodiment, a thin wafer (e.g., <300 um) is used for a solar cell. A fraction (>10%) of the wafer thickness exhibits low oxygen to avoid lifetime degradation mechanisms. Zero to low fractions of BMDs may be present to avoid internal gettering that results in low lifetime wafers (<100 μs). Solar cell processing can getter metallics to the wafer surface away from the wafer center. BMDs can generate residual stresses that increase the breakage of thin wafers used for solar cell processing, such as by reducing the concentration of interstitial oxygen in the wafer.

Asymmetric oxygen profiles also can be formed. Decoupled denuded zones can provide control over the oxygen profile that enables a high final wafer strength and tailored electrical properties. Decoupled denuded zones can be formed without excess wafer breakage or the cost of additional processing steps.

The wafers disclosed herein can be made using an HRG process. A system for HRG wafer production, such as that illustrated in FIG. 7, can include a crucible for housing a melt and a cold block having a cold block surface that directly faces an exposed surface of the melt. The cold block is configured to generate a cold block temperature at the cold block surface that is lower than a melt temperature of the melt at the exposed surface whereby a ribbon is formed on the melt. The cold block also can provide a cooling jet to assist in formation of the solid ribbon. During operation a melt is provided in the crucible. A ribbon is formed horizontally on the melt using the cold block with a cold block surface that directly faces an exposed surface of the melt. A melt-back heater can reduce a thickness of the ribbon in the melt after it is formed. The ribbon is pulled from the melt at a low angle off the melt surface using the puller. The ribbon may be pulled from the crucible at a 0° angle or at a small angle. The ribbon is supported and singulated into wafers, such as using a laser. The wafers made using this system can have the reduced oxygen concentration described herein. Oxygen outgas can occur in the melt or after separation from the melt.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. A semiconductor material comprising:
    a single crystal silicon ribbon floating on molten silicon, wherein
        the single crystal silicon ribbon has a thickness between a first surface and a second surface from 50 μm to 300 μm,
        the first surface and the second surface are opposite each other,
        the single crystal silicon ribbon includes a first region extending a first depth from the first surface toward the second surface, the first region has a reduced oxygen concentration relative to a bulk region of the single crystal silicon ribbon, and the single crystal silicon ribbon has a bulk minority carrier lifetime greater than 100 µs.

2. The semiconductor material of claim 1, wherein the first surface and the second surface are flat.

3. The semiconductor material of claim 1, wherein the first region has an oxygen concentration from 0.1 to 8.0 ppma.

4. The semiconductor material of claim 1, wherein the bulk region of the single crystal silicon ribbon has an oxygen concentration from 8 to 25 ppma.

5. The semiconductor material of claim 1, wherein the first depth is at least 5 µm.

6. The semiconductor material of claim 1, wherein the first depth is from 10% to 90% of the thickness.

7. The semiconductor material of claim 6, wherein the first depth is approximately 30% of the thickness.

8. The semiconductor material of claim 1, wherein the first region has a reduced concentration of bulk micro defects relative to the bulk region of the single crystal silicon ribbon.

9. The semiconductor material of claim 1, further comprising a second region extending a second depth from the second surface toward the first surface, and wherein the second region has a reduced oxygen concentration relative to the bulk region of the single crystal silicon ribbon disposed between the first region and the second region.

10. The semiconductor material of claim 9, wherein the second region has an oxygen concentration from 0.1 to 8.0 ppma.

11. The semiconductor material of claim 9, wherein the second depth is at least 5 µm.

12. The semiconductor material of claim 9, wherein the first depth and the second depth combined is from 10% to 90% of the thickness.

13. The semiconductor material of claim 9, wherein the second depth is approximately 10% of the thickness.

14. The semiconductor material of claim 9, wherein the first region and the second region have a reduced concentration of bulk micro defects relative to the bulk region of the single crystal silicon ribbon disposed between the first region and the second region.

15. The semiconductor material of claim 9, wherein the first depth and the second depth are different distances.

16. The semiconductor material of claim 1, wherein the single crystal silicon ribbon is rectangular.

17. The semiconductor material of claim 1, wherein the single crystal silicon ribbon further includes a dopant.

18. The semiconductor material of claim 1, wherein the single crystal silicon ribbon has an average oxygen precipitate count from 0 to 1e11/cm3 in the first region.

* * * * *